United States Patent
Osinski et al.

(10) Patent No.: US 10,770,861 B1
(45) Date of Patent: Sep. 8, 2020

(54) LIGHT-EMITTING DEVICE HAVING SELF-COOLED SEMICONDUCTOR LASER

(71) Applicant: STC.UNM, Albuquerque, NM (US)

(72) Inventors: Marek Osinski, Albuquerque, NM (US); Gennady A. Smolyakov, Albuquerque, NM (US)

(73) Assignee: UNM Rainforest Innovations, Albuquerque, NM (US)

( * ) Notice: Subject to any disclaimer, the term of this patent is extended or adjusted under 35 U.S.C. 154(b) by 0 days.

(21) Appl. No.: 16/413,570

(22) Filed: May 15, 2019

Related U.S. Application Data (60) Provisional application No. 62/672,226, filed on May 16, 2018.

(51) Int. Cl.
| | |
|---|---|
| *H01S 5/024* | (2006.01) |
| *H01S 5/026* | (2006.01) |
| *H01S 5/10* | (2006.01) |
| *H01S 5/125* | (2006.01) |
| *H01S 5/34* | (2006.01) |

(52) U.S. Cl.
CPC .......... *H01S 5/02461* (2013.01); *H01S 5/026* (2013.01); *H01S 5/101* (2013.01); *H01S 5/125* (2013.01); *H01S 5/34* (2013.01)

(58) Field of Classification Search
CPC ........ H01S 5/02461; H01S 5/105; H01S 5/34; H01S 5/3412
See application file for complete search history.

(56) References Cited

PUBLICATIONS

[Arcari 2014] M. Arcari, I. Sollner, A. Javadi, S. Lindskov Hansen, S. Mahmoodian, J. Liu, H. Thyrrestrup, E. H. Lee, J. D. Song, S. Stobbe, and P. Lodahl, "Near-unity coupling efficiency of a quantum emitter to a photonic crystal waveguide", *Phys. Rev. Lett.* 113 (#9), Art. 093603, 2014.
[Berishev 2005] I. Berishev, A. Komissarov, N. Moshegov, P. Trubenko, L. Wright, A. Berezin, S. Todorov, A. Ovtchinnikov, "AlGaInAs/GaAs record high-power conversion efficiency and record high-brightness coolerless 915-nm multimode pumps," *Proc. SPIE* 5738, pp. 25-32, 2005.
[Boriskina 2016] S. V. Boriskina, J. K. Tong, W. C. Hsu, B. L. Liao, Y. Huang, V. Chiloyan, and G. Chen, "Heat meets light on the nanoscale", *Nanophotonics* 5 (#1), pp. 134-160, Jun. 2016.
[Bowman 1999] S. R. Bowman, "Lasers without internal heat generation", *IEEE J. Quantum Electron.* 35 (#1), pp. 115-122, 1999.
[Bowman 2010] S. R. Bowman, S. P. O'Connor, S. Biswal, N. J. Condon, and A. Rosenberg, "Minimizing heat generation in solid-state lasers", *IEEE J. Quantum Electron.* 46 (#7), pp. 1076-1085, 2010.
[Bowman 2015] S. R. Bowman, "Optimizing average power in low quantum defect lasers", *Appl. Opt.* 54 (#31), pp. F78-F84, 2015.
[Chen 2005] C. C. Chen, C. Y. Chen, W. K. Wang, F. H. Huang, C. K. Lin, W. Y. Chiu, and Y. J . Chan, "Photonic crystal directional couplers formed by InAlGaAs nano-rods", *Opt. Exp.* 13 (#1), pp. 38-43, 2005.
[Crump 2006] P. Crump, M. Grimshaw, J. Wang, W. Dong, S. Zhang, S. Das, J. Farmer, M. DeVito, L. S. Meng, J. K. Brasseur, "85% power conversion efficiency 975-nm broad area diode lasers at -50 °C, 76% at 10 °C", presented at the *Quantum Electron. Laser Sci. Conf.*, Long Beach, CA, USA, 2006.

(Continued)

*Primary Examiner* — Michael Carter
(74) *Attorney, Agent, or Firm* — Keith Vogt, Ltd.; Keith A. Vogt (57) ABSTRACT

A light-emitting device having a self-cooled semiconductor laser having a laser cavity.

20 Claims, 4 Drawing Sheets

(56) References Cited

PUBLICATIONS

[Crump 2013] P. Crump, G. Erbert, H. Wenzel, C. Frevert, C. M. Schultz, K. H. Hasler, R. Staske, B. Sumpf, A. Maassdorf, F. Bugge, S. Knigge, G. Traenkle, "Efficient high-power laser diodes", *IEEE J. Sel. Topics Quantum Electron.* 19(#4), Art. 1501211, Jul.-Aug. 2013.

[Eliseev 2008] P. G. Eliseev, "Anti-Stokes luminescence in heavily doped semiconductors as a mechanism of laser cooling", *Opto-Electron. Rev.* 16 (#3), pp. 199-207, 2008.

[Engin 2012] E. Engin, J. L. O'Brien, and M. J. Cryan, "Design and analysis of a gallium nitride-on-sapphire tunable photonic crystal directional coupler", *J. Opt. Soc. Am. B* 29 (#6), pp. 1157-1164, 2012.

[Fernee 2007] M. J. Fernee, P. Jensen, and H. Rubinsztein-Dunlop, "Unconventional photoluminescence upconversion from PbS quantum dots", *Appl. Phys. Lett.* 91 (#4), Art. 043112, 2007.

[Fujita 2005] M. Fujita, S. Takahashi, Y. Tanaka, T. Asano, and S. Noda, "Simultaneous inhibition and redistribution of spontaneous light emission in photonic crystals", *Science* 308, pp. 1296-1298, 2005.

[Harbold 2007] J. M. Harbold and F. W. Wise, "Photoluminescence spectroscopy of PbSe nanocrystals", *Phys. Rev. B* 76 (#12), Art. 125304, 2007.

[Hassani 2016] I. H. Hassani, M. Rezaei, R. Brown, S. J. Jang, A. Turay, V. Fathipour, and H. Mohseni, "Efficient luminescence extraction strategies and anti-reflective coatings to enhance optical refrigeration of semiconductors", *J. Lumin.* 170, pp. 841-854, Pt. 3, 2016.

[Kanskar 2005] M. Kanskar, T. Earles, T. J. Goodnough, E. Stiers, D. Botez, L. J. Mawst, "73% CW power conversion efficiency at 50W from 970 nm diode laser bars," *Electron. Lett.* 41 (#5), pp. 245-247, Mar. 2005.

[Ke 2015] Q. Ke, S. Y. Tan, S. T. Liu, D. Lu, R. K. Zhang, W. Wang, C. Ji, "Fabrication and optimization of 1.55-μm InGaAsP/InP high-power semiconductor diode laser", *J. Semicond.* 36(#9), Art. 094010, Sep. 2015.

[Kim 2002] S. H. Kim, H. Y. Ryu, H. G. Park, G. H. Kim, Y. S. Choi, Y. H. Lee, and J. S. Kim, "Two-dimensional photonic crystal hexagonal waveguide ring laser", *Appl. Phys. Lett.* 81 (#14), pp. 2499-2501, 2002.

[Knigge 2005] A. Knigge, G. Erbert, J. Jonsson, W. Pittroff, R. Staske, B. Sumpf, M. Weyers, G. Trankle, "Passively cooled 940-nm laser bars with 73% wall-plug efficiency at 70 W and 25 °C," *Electron. Lett.* 41 (#5), pp. 250-251, Mar. 2005.

[Laikhtman 2005] B. Laikhtman, A. Gourevitch, D. Westerfeld, D. Donetsky, G. Belenky, "Thermal resistance and optimal fill factor of a high power diode laser bar", *Semicond. Sci. Technol.* 20 (#10), pp. 1087-1095, Oct. 2005.

[Lauer 2012] C. Lauer, H. Koenig, G. Groenninger, S. Hein, A. Gomez-Iglesias, M. Furitsch, J. Maric, H. Kissel, P. Wolf, J. Biesenhaddam, U. Strauss, "Advances in performance and beam quality of 9xx nm laser diodes tailored for efficient fiber coupling," *Proc. SPIE* 8241, Art. 824111, 2012.

[Li 2007] H. Li, T. Towe, I. Chyr, D. Brown, T. Nguyen, F. Reinhardt, X. Jin, R. Srinivasan, M. Berube, T. Truchan, R. Bullock, J. Harrison, "Near 1 kW of continuous-wave power from a single high-efficiency diode-laser bar", *IEEE Photon. Technol. Lett.* 19(#13-16), pp. 960-962, Jul.-Aug. 2007.

[Li 2014] D. Li, J. Zhang, X. J. Wang, B. L. Huang, and Q. H. Xiong, "Solid-state semiconductor optical cryocooler based on CdS nanobelts", *Nano Let.* 14 (#8), pp. 4724-4728, 2014.

[Moghaddam 2010] M. K. Moghaddam, A. R. Attari, and M. M. Mirsalehi, "Improved photonic crystal directional coupler with short length", *Photonics Nanostruct.* 8 (#1), pp. 47-53, 2010.

[Mungan 2003] C. E. Mungan, "Thermodynamics of radiation-balanced lasing", *J. Opt. Soc. Am. B* 20 (#5), pp. 1075-1082, 2003.

[Mungan 2005] C. E. Mungan, "Radiation thermodynamics with applications to lasing and fluorescent cooling", *Am. J. Phys.* 73 (#4), pp. 315-322, 2005.

[Nemova 2010] G. Nemova and R. Kashyap, "Laser cooling of solids", *Rep. Progr. Phys.* 73 (#8), Art. 086501, 2010.

[Nemova 2012] G. Nemova and R. Kashyap, "Laser cooling with PbSe colloidal quantum dots", *J. Opt. Soc. Am. B* 29 (#4), pp. 676-682, 2012.

[Noda 2007] S. Noda, M. Fujita, and T. Asano, "Spontaneous-emission control by photonic crystals and nanocavities", *Nature Photon.* 1 (#8), pp. 449-458, 2007.

[Notomi 2004] M. Notomi, A. Shinya, S. Mitsugi, E. Kuramochi, and H. Y. Ryu, "Waveguides, resonators and their coupled elements in photonic crystal slabs", *Opt. Exp.* 12 (#8), pp. 1551-1561, 2004.

[Peters 2005] M. Peters, V. Rossin, B. Acklin, "High-efficiency high-reliability laser diodes at JDS Uniphase," *Proc. SPIE* 5711, pp. 142-151, 2005.

[Poles 1999] E. Poles, D. C. Selmarten, 0. I. Mićić, and A. J. Nozik, "Anti-Stokes photoluminescence in colloidal semiconductor quantum dots", *Appl. Phys. Lett.* 75 (#7), pp. 971-973, 1999.

[Qiang 2010] Z. Qiang, R. A. Soref, and W. D. Zhou, "Photonic crystal ring resonators: characteristics and applications", *J. Nanosci. Nanotechnol.* 10 (#3), pp. 1495-1507, 2010.

[Rakovich 2002a] Y. P. Rakovich, S. A. Filonovich, M. J. M. Gomes, J. F. Donegan, D. V. Talapin, A. L. Rogach, and A. Eychmtiller, "Anti-Stokes photoluminescence in II-VI colloidal nanocrystals", *Phys. Stat. Sol. B* 229 (#1), pp. 449-452, 2002.

[Rakovich 2002b] Y. P. Rakovich, A. A. Gladyshchuk, K. I. Rusakov, S. A. Filonovich, M. J. M. Gomes, D. V. Talapin, A. L. Rogach, and A. Eychmtiller, "Anti-Stokes luminescence of cadmium telluride nanocrystals", *J. Appl. Spectrosc.* 69 (#3), pp. 444-449, 2002.

[Rakovich 2009] Y. P. Rakovich, J. F. Donegan, M. I. Vasilevskiy, and A. L. Rogach, "Anti-Stokes cooling in semiconductor nanocrystal quantum dots: A feasibility study", *Phys. Status Solidi A* 206 (#11), pp. 2497-2509, 2009.

[Rusakov 2003] K. I. Rusakov, A. A. Gladyshchuk, Y. P. Rakovich, J. F. Donegan, S. A. Filonovich, M. J. M. Gomes, D. V. Talapin, A. L. Rogach, and A. Eychmtiller, "Control of efficiency of photon energy up-conversion in CdSe/ZnS quantum dots", *Opt. Spectr.* 94 (#6), pp. 859-863, 2003.

[Saini 2007] S. S. Saini, S. H. Cho, M. Dagenais, "Thermal considerations in high power semiconductor lasers and semiconductor optical amplifiers", in *Photonics Packaging, Integration, and Interconnects VII* (A. M. Earman, R. T. Chen, Eds.), *Proc. SPIE* 6478, Art. 647805, 2007.

[Seletskiy 2010] D. V. Seletskiy, M. P. Hasselbeck, M. Sheik-Bahae, "Resonant cavity-enhanced absorption for optical refrigeration", *Appl. Phys. Lett.* 96(#18), Art. 181106, May 2010.

[Sheik-Bahae 2007] M. Sheik-Bahae, R. I. Epstein, "Optical refrigeration", *Nature Photon.* 1 (#12), pp. 693-699, Dec. 2007.

[Smolyakov 2011a] G. A. Smolyakov and M. Osiński, "Rate equation analysis of dynamic response in strongly injection-locked semiconductor microring lasers", in *Physics and Simulation of Optoelectronic Devices XIX* (B. Witzigmann, F. Henneberger, Y. Arakawa, and A. Freundlich, Eds.), SPIE International Symp. on Integrated Optoelectronic Devices OPTO 2011, San Francisco, CA, Jan. 24-27, 2011, *Proc. SPIE* 7933, Art. 79330D (12 pp.).

[Smolyakov 2011b] G. A. Smolyakov and M. Osiński, "High-speed modulation analysis of strongly injection-locked semiconductor ring lasers", *J. Quantum Electron.* 47 (#11), pp. 1463-1471, Nov. 2011.

[Souto 2016] J. Souto, J. L. Pura, J. Jimenez, "About the physical meaning of the critical temperature for catastrophic optical damage in high power quantum well laser diodes", *Laser Phys. Lett.* 13(#2), Art. 025005, Feb. 2016.

[Sugisaka 2012] J.-I. Sugisaka, N. Yamamoto, M. Okano, K. Komori, and M. Itoh, "Demonstration of the wide control range Q factor of ring cavity with ultrashort directional coupler and curved photonic-crystal ring waveguide", *J. Opt. Soc. Am. B* 29 (#6), pp. 1521-1527, 2012.

(56) References Cited

PUBLICATIONS

[Strasser 2007] P. Strasser, R. Flueckiger, R. Wuest, F. Robin, and H. Jaeckel, "InP-based compact photonic crystal directional coupler with large operation range", *Opt. Exp.* 15 (#13), pp. 8472-8478, 2007.

[Tanaka 2005] Y. Tanaka, Y. Sugimoto, N. Ikeda, H. Nakamura, K. Asakawa, and K. Inoue, "Wavelength-dependent coupling characteristics in two-dimensional photonic-crystal slab directional coupler", *Jap. J. Appl. Phys.* 44 (#7A), pp. 4971-4974, 2005.

[Wang 2003] X. Y. Wang, W. W. Yu, J. Y. Zhang, J. Aldana, X. G. Peng, and M. Xiao, "Photoluminescence upconversion in colloidal CdTe quantum dots", *Phys. Rev. B* 68 (#12), Art. 125318, 2003.

[Welch 2000] D. F. Welch, "A brief history of high-power semiconductor lasers", *IEEE J. Sel. Topics Quantum Electron.* 6 (#6), pp. 1470-1477, Nov.-Dec. 2000.

[Xiong 2017] Y. Xiong, C. Liu, J. Wang, J. J. Han, and X. J. Zhao, "Near-infrared anti-Stokes photoluminescence of PbS QDs embedded in glasses", *Opt. Exp.* 25 (#6), pp. 6874-6882, 2017.

[Yamamoto 2006] N. Yamamoto, T. Ogawa, and K. Komori, "Photonic crystal directional coupler switch with small switching length and wide bandwidth", *Opt. Exp.* 14 (#3), pp. 1223-1229, 2006.

[Zhang 2013] J. Zhang, D. H. Li, R. J. Chen, and Q. H. Xiong, "Laser cooling of a semiconductor by 40 kelvin", *Nature* 493 (#7433), pp. 504-508, 2013.

[Zhang 2014] Y. Zhang, C. Zeng, D. P. Li, G. Gao, Z. Z. Huang, J. Z. Yu, and J. S. Xia, "High-quality-factor photonic crystal ring resonator", *Opt. Let.* 39 (#5), pp. 1282-1285, 2014.

[Zhang 2016] Q. Zhang, X. F. Liu, M. I. B. Utama, G. C. Xing, and T. C. Q. H. Xiong, "Phonon-assisted anti-Stokes lasing in ZnTe nanoribbons", *Adv. Mater.* 28 (#2), pp. 276-283, 2016.

[Zhong 2011] L. Zhong and X. Ma (2011). Recent developments in high power semiconductor diode lasers, Optoelectronics—Devices and Applications, Prof. P. Predeep (Ed.), ISBN: 978-953-307-576-1, InTech, Available from: http://www.intechopen.com/books/optoelectronics-devices-and-applications/recentdevelopments-in-high-power-semiconductor-diode-lasers.

[Zhong 2014] B. Zhong, Y. H. Jia, L. Chen, Y. C. Deng, Y. Q. Chen, and J. P. Yin, "Cavity-enhanced laser cooling for $Yb^{3+}$-doped fluoride crystal using a low-power diode laser", *J. Opt. Soc. Am. B* 31 (#9), pp. 2116-2120, 2014.

[Zimmermann 2004] J. Zimmermann, M. Kamp, A. Forchel, and R. Marz, "Photonic crystal waveguide directional couplers as wavelength selective optical filters", *Opt. Commun.* 230 (#4-6), pp. 387-392, 2004.

[Zorn 2012] M. Zorn, R. Huelsewede, O. Hirsekorn, J. Sebastian, P. Hennig, "High-power single emitters and laser bars with improved performance developed at JENOPTIK," *Proc. SPIE* 8241, Art. 824110, 2012.

LIGHT-EMITTING DEVICE HAVING SELF-COOLED SEMICONDUCTOR LASER

RELATED APPLICATIONS

This application claims the benefit of U.S. Provisional Application No. 62/672,226 filed May 16, 2018 and herein incorporated by reference.

STATEMENT REGARDING FEDERALLY SPONSORED RESEARCH & DEVELOPMENT

This invention was made with government support under Grant No. N00014-15-1-2190 awarded by the Office of Naval Research. The government has certain rights in the invention.

INCORPORATION BY REFERENCE OF MATERIAL SUBMITTED ON A COMPACT DISC

Not applicable.

FIELD OF THE INVENTION

The present invention relates to self-cooled light-emitting semiconductor laser devices and, in particular, to a self-cooled edge-emitting Fabry-Perot semiconductor laser and to a self-cooled injection-lockable semiconductor ring laser.

BACKGROUND OF THE INVENTION

A. Radiation-Balanced Lasers and Laser Cooling

Figure 1:
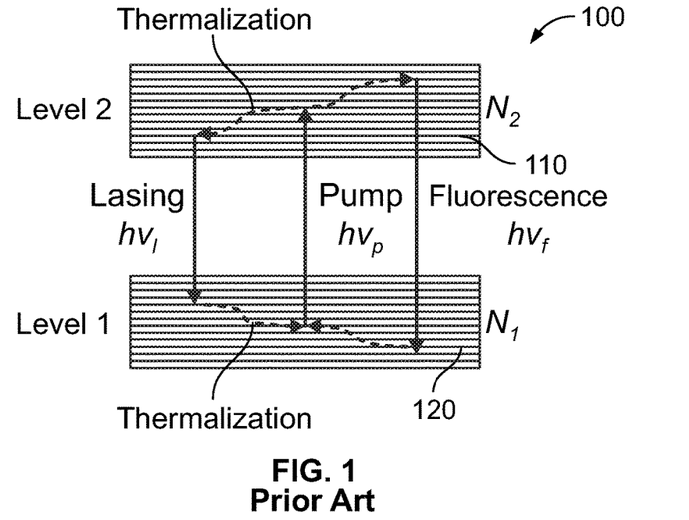
FIG. 1 shows an energy-level scheme for a radiation-balanced laser.

Waste heat generation is a generic problem in laser systems. Reduction of thermal loading is of crucial importance in high-power and cryogenic laser applications. The process of excitation and stimulated emission in conventional solid-state/semiconductor/organic lasers results in heat generation in the lasing medium. This is always the case because of the Stokes energy shift between the higher-energy pump photons (for optical pumping) or injected carriers (for electrical current injection) and the lower-energy laser output photons, often called the quantum defect. This means conventional solid-state/semiconductor/organic lasers are always exothermic. In 1999, a concept of a solid-state bulk laser was introduced without internal heat generation, nowadays called a radiation-balanced or a thermal laser. The use of radiation cooling by anti-Stokes fluorescence within the laser medium has been suggested to balance the heat generated by the Stokes-shifted stimulated emission. A laser cooling cycle in a solid 100 is illustrated in FIG. 1. The upper 110 and lower 120 electronic levels (manifolds) are split into many closely spaced sublevels (energy bands in case of semiconductor materials). Pump photons at the long wavelength tail of the absorption spectrum with the energy $h\nu_p$ excite the low-energy electronic transitions from the ground state to the excited state. The excited ions in a host matrix (or carriers in a semiconductor material) absorb phonons during the thermalization process and reach quasi-equilibrium with the lattice. Fluorescence then follows with a mean photon energy $h\nu_f$ higher than that of the absorbed photon, thus removing energy from the sample. For electrical current injection in semiconductor injection lasers, the pump energy is given by e U, where U is the voltage applied to the p-n junction.

The essential condition for achieving cooling in solids is availability of a high quantum efficiency anti-Stokes transition and low non-radiative recombination rate. It is equally important that anti-Stokes spontaneous emission escapes the material without trapping and reabsorption, which would cause re-heating of the sample. These requirements can be satisfied for rare-earth ions in hosts with low phonon energy and low-index of the host material, such as fluoride or chloride glasses and crystals. In semiconductors, however, the problems with the realization of laser cooling include relatively high nonradiative recombination rate, low extraction efficiency of spontaneous emission due to the total internal reflection, and the reabsorption effect. Laser cooling of semiconductors has been attempted for decades in III-V semiconductor quantum wells without success. Significant breakthroughs have been recently reported by using II-VI, rather than III-V, nanomaterials. In particular, laser cooling by 40 K has been observed in II-VI CdS nanoribbons and by 30 K in CdS nanobelts. Very intense phonon-assisted anti-Stokes photoluminescence and even lasing has recently been reported in ZnTe nanoribbons. The net laser cooling in those II-VI materials was attributed to strong coupling between excitons and longitudinal optical phonons (LOPs) that allowed the resonant annihilation of multiple LOPs in the luminescence up-conversion processes, high external quantum efficiency, and negligible background absorption. These II-VI materials are very promising for development of self-cooled and radiation-balanced semiconductor lasers, where anti-Stokes emission would mitigate the heating effect.

As mentioned above, a significant challenge that needs to be addressed in radiation-balanced lasers is the photoluminescence trapping and the consequent photon recycling. Effective strategies to reduce photon trapping are needed to assist laser cooling. Photons get trapped inside a material due to the total internal reflection. The escape cone for a boundary between a bulk material with index n and air is equal to $2n^2 4\pi$ steradians, which leads to an extraction efficiency of $\sim \frac{1}{2}n^2$. The index and the size of the structure determines the amount of the power radiated out of the material—the higher the index and size of the material the higher the localization of the optical mode inside the material. This simple formula predicts a very low extraction efficiency of ~5.5% for semiconductors with the refractive index of 3, not usually sufficient for laser cooling purposes. Moreover, in cryogenic environments, the problem of photon trapping is only partially solved with the energy extracted out of the sample. Unless it leaves the cryogenic chamber completely, the isotropic spontaneous emission will eventually get reabsorbed and will heat the cryogenic environment. Therefore, it is very desirable to find a strategy for directional extraction of spontaneous emission out of the laser device and outside of the cryogenic chamber.

B. Thermal Considerations in High-Power Semiconductor Lasers

High-power semiconductor lasers are in high demand in industrial, medical, military, communication, recordable optical data storage, and other fields. The main factor limiting the maximum power of a high-power semiconductor laser in continuous wave (CW) operation is self-heating at high drive currents determined by electrical to optical power conversion efficiency and the thermal load that the laser assembly can dissipate.

Self-heating is detrimental in several ways leading, for example, to thermal rollover and catastrophic optical damage in semiconductor lasers. At higher internal temperature, active region gain drops significantly, whereas carrier leakage from the active region and Auger recombination rate increases. Thus, the laser has a higher threshold and lower slope efficiency, that is lower power efficiency. To reach a certain power level at high temperature, the pump current should be much higher than that at room temperature. Thermal rollover thus occurs at high drive currents, with output power peaking at a particular point and then reducing with additional increase in current. The catastrophic optical damage in semiconductor lasers is a failure mode described as thermal runaway process in which a local temperature increase plays an important role. The locally increased temperature causes shrinkage of the active region energy bandgap with a corresponding enhancement of the optical absorption and eventual melting of the active region semiconductor material in a feedback process.

The two key countermeasures against self-heating in high-power semiconductor lasers are to maximize their power conversion efficiency (PCE) and minimize thermal resistance. To date, the highest values of PCE are demonstrated in GaAs-based broad-area lasers. The highest reported PCE at heat sink temperature >0° C. is 76% for devices at 975 nm, and PCE over 70% has been reported by several research groups for single emitters and laser bars in the 900-1000 nm wavelength range. However, the demonstrated high peak efficiencies typically occur at relatively low power per emitter, in the 2-5 W range for single emitters with stripe width ~90 µm, which is insufficient for many applications. Efficiency increase of ~10% relative to conventional designs has been demonstrated at high powers in semiconductor lasers of extreme double asymmetric design. The thermal resistance is dependent on the laser chip/bar geometry, such as the pumped area to total chip/bar area ratio (fill factor) and the cavity length. A larger thermal footprint enables a lower operating temperature at a given heat load.

The major characteristics of high-power lasers are strongly affected by the quality of the package designed for efficient heat transfer from the junction and by the cooling mechanisms used to remove the heat. Depending on the thermal power density, two different types of heat sinks are used: active and conductive. For CW and long-pulse operational mode, active cooling is necessary. The active heat sinks can further be subdivided into liquid-cooled micro- or macro-channel heat sinks, liquid-impingement jets, and evaporative sprays. Some high-power laser applications, however, require that high-power lasers operate in a high temperature environment without any active cooling. Therefore, an alternative strategy for cooling high-power semiconductor lasers is highly desirable in support of passive conductive cooling for such applications.

C. Strongly Injection-Locked Unidirectional Whistle-Geometry Microring Lasers

Figure 2:
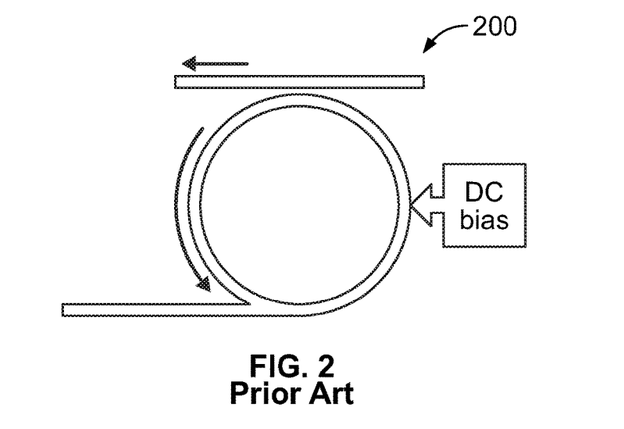
FIG. 2 is a schematic diagram of a whistle-geometry ring laser.
Figure 3:
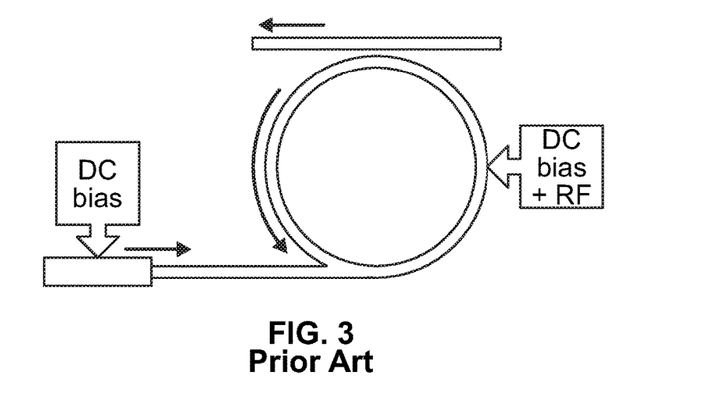
FIG. 3 is a schematic diagram of an optically injection-locked (strong injection) whistle-geometry ring laser monolithically integrated with a single-frequency master laser.

To control directionality of lasing in ring resonators, a novel whistle-geometry ring laser (WRL) structure 200 is shown in FIG. 2 and described in U.S. Pat. No. 8,009,712, the teachings of which are incorporated herein by reference. The WRL structure is particularly attractive when strong injection of external light into the ring resonator is desirable, for example in the case of high-speed semiconductor lasers. As illustrated in FIG. 3, the WRL geometry allows for strong coupling of a single-frequency master laser output into the slave laser. The advantage of the injection-locking scheme illustrated in FIG. 3 for ultra-high-speed modulation was confirmed in numerical modeling.

D. Spontaneous Emission Control in Dielectric-Waveguide-Based Laser Cavities

For the full directional control of the spontaneous emission in a cavity to be realized, all the spontaneous emission events must couple spatially into the guided modes. In other words, a spontaneous emission pattern that emits solely into the guided modes, which requires minimization of spontaneous emission into the radiation modes is desired. A typical situation in dielectric-waveguide-based resonators, however, is just the opposite. The guided modes are supported by the total internal reflection and the active region waveguide is designed to support only fundamental transverse guided mode. With the low refractive index contrast between the active region waveguide core and the surrounding cladding layers, most of the spontaneous emission escapes from the active region layer and gets trapped inside the laser chip due to small escape cone for the interface between the bulk material with the refractive index n 3 and air with n=1.

E. Spontaneous Emission Control by Photonic Crystals

In contrast to dielectric-waveguide-based resonators, the resonant modes in photonic crystal (PhC) resonators (PCRs) are supported by the photonic bandgap (PBG) effect, which is much more efficient for optical confinement. For example, PhC structures have the potential to achieve high-Q, low-loss resonators in ultra-compact cavities several times smaller than the minimum-possible-size dielectric-waveguide-based resonators. What is of even greater importance is the unique capability of PhCs to control spontaneous emission due to PBG effect, not attainable in conventional dielectric-waveguide-based cavities. Spontaneous-emission control by 2D PhCs has been demonstrated. It has been shown that the overall spontaneous emission rate can be substantially reduced by the 2D PBG, while the light-emission efficiency for a direction where the 2D PBG is not present, can be significantly enhanced. This result clearly demonstrates that when spontaneous emission is inhibited by the 2D PBG effect in a certain direction (and thus the excited carriers are forbidden to recombine by emitting spontaneous photons in that direction), the carriers are eventually used by emitting spontaneous photons in other directions. This effect was referred to as "the inhibition of spontaneous emission and the redistribution of the saved energy." Theoretically, a near-unity efficiency of a quantum dot emitter coupling to a PhC waveguide has been predicted. In general, photon density of states (DoS) modification allowed by PhCs can be used to boost the efficiency of the optical refrigeration in two ways. First, a fluorescence peak can be blue-shifted by suppressing the photon DoS in a spectral range below the pump frequency $v_p$ (Stokes component of spontaneous emission), thus increasing $v_f$. Additionally, an increase of the radiative rate at the blue-shifted emission wavelength could increase the external quantum efficiency $\eta_{ext}$.

BRIEF SUMMARY OF THE INVENTION

In one embodiment, the present invention provides a light-emitting device having a self-cooled injection-lockable ring laser, comprising: a ring laser; an injecting waveguide used to collect light from an external laser source and to deliver it to the ring laser; a waveguide directional output coupler proximate, in the lateral direction, to the cavity of the ring laser and used to collect its output.

In other embodiments, the present invention provides a light-emitting device, wherein the ring laser, the injecting waveguide, and the directional output coupler are semiconductor waveguide structures monolithically integrated on the same substrate, and the ring laser has whistle geometry.

In other embodiments, the present invention provides a light-emitting device that may be implemented in any semiconductor material system with high efficiency of anti-Stokes photoluminescence.

In other embodiments, the present invention provides a light-emitting device, wherein the size of the ring laser cavity is small enough for a substantial part of the generated anti-Stokes spontaneous emission to couple into guided modes of the cavity for efficient removal from the cavity through the directional output coupler.

In other embodiments, the present invention provides a light-emitting device, wherein colloidal quantum dot emitters grown in any semiconductor material system with high efficiency of anti-Stokes photoluminescence are inserted into nanocavities prefabricated in the core of the ring resonator waveguide made of a wider-bandgap semiconductor material.

In other embodiments, the present invention provides a light-emitting device, wherein the size of the ring laser cavity is small enough for a substantial part of the generated anti-Stokes spontaneous emission to couple into guided modes of the cavity for efficient removal from the cavity through the directional output coupler.

In other embodiments, the present invention provides a light-emitting device, In other embodiments, the present invention provides a light-emitting device, wherein the integration substrate is made of III-V or II-VI semiconductor materials.

In other embodiments, the present invention provides a light-emitting device, wherein the integration substrate is a silicon-on-insulator substrate.

In other embodiments, the present invention provides a light-emitting device, wherein the ring laser, the injecting waveguide, and the directional output coupler are slab photonic-crystal waveguide structures defined through the photonic bandgap confinement effect, in a cubic, hexagonal, or other complex photonic-crystal lattice fabricated in the same substrate.

In other embodiments, the present invention provides a light-emitting device, wherein the slab photonic-crystal waveguide structures are realized in any semiconductor material system with high efficiency of anti-Stokes photoluminescence.

In other embodiments, the present invention provides a light-emitting device, wherein colloidal quantum dot emitters grown in any semiconductor material system with high efficiency of anti-Stokes photoluminescence are inserted into nanocavities prefabricated in the core of the photonic-crystal ring resonator waveguide made of a wider-bandgap semiconductor material.

In other embodiments, the present invention provides a light-emitting device, wherein the wavelength-selective photonic-crystal directional output coupler is designed in such a way as to preferentially outcouple the anti-Stokes spontaneous emission, and to extract only a small portion of the injected/lasing Stokes emission.

In other embodiments, the present invention provides a light-emitting device, wherein the spontaneous emission is further confined in the vertical direction by one-dimensional stacks of distributed-Bragg-reflectors fabricated below and above the slab photonic-crystal ring laser cavity.

In other embodiments, the present invention provides a light-emitting device, wherein the peak reflectivity and bandwidth of the distributed-Bragg-reflectors spectrally match the spontaneous emission circulating inside the photonic-crystal ring laser cavity.

In other embodiments, the present invention provides a light-emitting device having a self-cooled ring laser, comprising: a ring laser; a waveguide directional output coupler proximate, in the lateral direction, to the cavity of the ring laser and used to collect its output.

In other embodiments, the present invention provides a light-emitting device that may be implemented in any semiconductor material system with high efficiency of anti-Stokes photoluminescence.

In other embodiments, the present invention provides a light-emitting device, wherein the size of the ring laser cavity is small enough for a substantial part of the generated anti-Stokes spontaneous emission to couple into guided modes of the cavity for efficient removal from the cavity through the directional output coupler.

In other embodiments, the present invention provides a light-emitting device, wherein colloidal quantum dot emitters grown in any semiconductor material system with high efficiency of anti-Stokes photoluminescence are inserted into nanocavities prefabricated in the core of the ring resonator waveguide made of a wider-bandgap semiconductor material.

In other embodiments, the present invention provides a light-emitting device, wherein the size of the ring laser cavity is small enough for a substantial part of the generated anti-Stokes spontaneous emission to couple into guided modes of the cavity for efficient removal from the cavity through the directional output coupler.

In other embodiments, the present invention provides a light-emitting device, wherein the ring laser and the waveguide directional output are monolithically integrated on a substrate made of III-V or II-VI semiconductor materials.

In other embodiments, the present invention provides a light-emitting device, wherein the ring laser and the waveguide directional output are monolithically integrated on a silicon-on-insulator substrate.

In other embodiments, the present invention provides a light-emitting device, wherein the ring laser and the directional output coupler are slab photonic-crystal waveguide structures defined, through the photonic bandgap confinement effect, in a cubic, hexagonal, or other complex photonic-crystal lattice fabricated in the same substrate.

In other embodiments, the present invention provides a light-emitting device, wherein the slab photonic-crystal waveguide structures are realized in any semiconductor material system with high efficiency of anti-Stokes photoluminescence.

In other embodiments, the present invention provides a light-emitting device, wherein colloidal quantum dot emitters grown in any semiconductor material system with high efficiency of anti-Stokes photoluminescence are inserted into nanocavities prefabricated in the core of the photonic-crystal ring resonator waveguide made of a wider-bandgap semiconductor material.

In other embodiments, the present invention provides a light-emitting device, wherein the wavelength-selective photonic-crystal directional output coupler is designed in such a way as to preferentially outcouple the anti-Stokes spontaneous emission, and to extract only a small portion of the lasing Stokes emission.

In other embodiments, the present invention provides a light-emitting device, wherein the spontaneous emission is further confined in the vertical direction by one-dimensional stacks of distributed-Bragg-reflectors fabricated below and above the slab photonic-crystal ring laser cavity.

In other embodiments, the present invention provides a light-emitting device, wherein the peak reflectivity and bandwidth of the distributed-Bragg-reflectors spectrally match the spontaneous emission circulating inside the photonic-crystal ring laser cavity.

In other embodiments, the present invention provides a light-emitting device having a self-cooled semiconductor laser, comprising a laser resonator with a waveguide bound by a slab photonic-crystal structure defined, through the photonic bandgap confinement effect, in a cubic, hexagonal, or other complex photonic-crystal lattice fabricated in the same substrate.

In other embodiments, the present invention provides a light-emitting device, where the laser resonator is a Fabry-Perot cavity.

In other embodiments, the present invention provides a light-emitting device, where the laser resonator is a distributed-feedback cavity.

In other embodiments, the present invention provides a light-emitting device, where the laser resonator is a distributed Bragg reflector cavity.

In other embodiments, the present invention provides a light-emitting device, wherein the laser resonator is implemented in any semiconductor material system with high efficiency of anti-Stokes photoluminescence.

In other embodiments, the present invention provides a light-emitting device, wherein the size of the laser cavity is small enough for a substantial part of the generated anti-Stokes spontaneous emission to couple into guided modes of the cavity for efficient removal from the cavity.

In other embodiments, the present invention provides a light-emitting device, wherein colloidal quantum dot emitters grown in any semiconductor material system with high efficiency of anti-Stokes photoluminescence are inserted into nanocavities prefabricated in the core of the photonic-crystal resonator waveguide made of a wider-bandgap semiconductor material.

In other embodiments, the present invention provides a light-emitting device, wherein the size of the laser cavity is small enough for a substantial part of the generated anti-Stokes spontaneous emission to couple into guided modes of the cavity for efficient removal from the cavity.

In other embodiments, the present invention provides a light-emitting device, wherein the laser resonator and the slab photonic-crystal structure are monolithically integrated on a substrate made of III-V or II-VI semiconductor materials.

In other embodiments, the present invention provides a light-emitting device, wherein the ring laser and the slab photonic-crystal structure are monolithically integrated on a silicon-on-insulator substrate.

In other embodiments, the present invention provides a light-emitting device, wherein the spontaneous emission is further confined in the vertical direction by one-dimensional stacks of distributed-Bragg-reflectors fabricated below and above the slab photonic-crystal laser cavity.

In other embodiments, the present invention provides a light-emitting device, wherein the peak reflectivity and bandwidth of the distributed-Bragg-reflectors spectrally match the spontaneous emission circulating inside the photonic-crystal laser cavity.

In other embodiments, the present invention provides a light-emitting device having a self-cooled semiconductor laser having a laser cavity.

In other embodiments, the present invention provides a light-emitting device having a self-cooled semiconductor laser having a laser cavity further including a laser resonator with a waveguide bound by a slab photonic-crystal structure that is defined in a cubic, hexagonal, or complex photonic-crystal lattice fabricated in the same structure as the semiconductor laser.

In other embodiments, the present invention provides a light-emitting device having a self-cooled semiconductor laser having a laser cavity further including a laser resonator that is a Fabry-Perot cavity, a distributed-feedback cavity, a distributed Bragg reflector cavity or is a ring cavity.

In other embodiments, the present invention provides a light-emitting device having a self-cooled semiconductor laser having a laser cavity wherein the self-cooled semiconductor laser is an injection-lockable ring laser, comprising a ring laser, an injecting waveguide used to collect light from an external laser source and to deliver it to the ring laser, a waveguide directional output coupler proximate, in the lateral direction, to the cavity of the ring laser and used to collect its output; all monolithically integrated on the same substrate, and the ring laser has whistle geometry.

In other embodiments, the present invention provides a light-emitting device having a self-cooled semiconductor laser having a laser cavity further including nanoemitters having anti-Stokes photoluminescence when excited by the internal laser emission, are inserted into a core of the waveguide, the waveguide made of a wider-bandgap semiconductor material than the nanoemitters.

In other embodiments, the present invention provides a light-emitting device having a self-cooled semiconductor laser having a laser cavity further including a laser cavity that is small enough for a substantial part of the generated anti-Stokes spontaneous emission of nanoemitters couple into guided modes of the cavity for efficient removal from the cavity.

In other embodiments, the present invention provides a light-emitting device having a self-cooled semiconductor laser wherein the laser resonator and the slab photonic-crystal structure are monolithically integrated on a substrate made of III-V or II-VI semiconductor materials.

In other embodiments, the present invention provides a light-emitting device having a self-cooled semiconductor laser wherein the laser resonator and the slab photonic-crystal structure are monolithically integrated on a silicon-on-insulator substrate.

In other embodiments, the present invention provides a light-emitting device having a self-cooled semiconductor laser wherein spontaneous emission is further confined in the vertical direction by one-dimensional stacks of distributed-Bragg-reflectors fabricated below and above the slab photonic-crystal laser cavity.

In other embodiments, the present invention provides a light-emitting device having a self-cooled semiconductor laser wherein the peak reflectivity and bandwidth of the distributed-Bragg-reflectors spectrally match the spontaneous emission circulating inside the photonic-crystal laser cavity.

Additional objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

BRIEF DESCRIPTION OF THE SEVERAL VIEWS OF THE DRAWINGS

In the drawings, which are not necessarily drawn to scale, like numerals may describe substantially similar components throughout the several views. Like numerals having different letter suffixes may represent different instances of substantially similar components. The drawings illustrate generally, by way of example, but not by way of limitation, a detailed description of certain embodiments discussed in the present document.

DETAILED DESCRIPTION OF THE INVENTION

Detailed embodiments of the present invention are disclosed herein; however, it is to be understood that the disclosed embodiments are merely exemplary of the invention, which may be embodied in various forms. Therefore, specific structural and functional details disclosed herein are not to be interpreted as limiting, but merely as a representative basis for teaching one skilled in the art to variously employ the present invention in virtually any appropriately detailed method, structure or system. Further, the terms and phrases used herein are not intended to be limiting, but rather to provide an understandable description of the invention.

The present invention concerns various preferred embodiments of optical designs for a self-cooled edge-emitting Fabry-Perot (FP) semiconductor laser and for a strongly injection-locked ring laser (RL) with minimized internal heating that would efficiently address the problem of directional extraction of spontaneous emission. The self-cooled semiconductor laser embodiments may be implemented in any semiconductor material system (including III-V, II-VI, or IV-VI semiconductors) with high efficiency of anti-Stokes photoluminescence. In a preferred embodiment, a semiconductor material with high efficiency of anti-Stokes photoluminescence is directly used as the active region material providing optical gain for lasing and, at the same time, providing cooling effect through the anti-Stokes photoluminescence. In addition, the properties/quality of the active region material (such as high optical gain and high efficiency of anti-Stokes luminescence) are not easy to meet in one specific material. To overcome this problem, the present invention provides an alternative embodiment of a self-cooled semiconductor laser, where colloidal quantum dot (QD) emitters grown in any semiconductor material system (including III-V, II-VI, or IV-VI semiconductors) with high efficiency of anti-Stokes photoluminescence are inserted into nanocavities prefabricated in the optical waveguide layer of the epitaxial laser structure waveguide made of a wider-bandgap semiconductor material. Thus, the QD nanoemitters will be optically pumped by the internal laser emission and provide cooling, similar to the laser cooling scheme of rare-earth doped glasses optically pumped with external laser light.

To date, anti-Stokes spontaneous luminescence caused by single-photon phonon-assisted carrier excitation has been reported for InP, CdSe, CdTe, PbS, and PbSe QDs. The embodiments of the present invention also overcome the known problem of very low absorption of the pump light in the latter scheme by putting nanoemitters, such as QD emitters, inside the laser cavity and, thus, employing the effect of cavity-enhanced absorption of the pump light.

Implementation in Dielectric-Waveguide-Based Platforms

Self-cooled injection-locked whistle-geometry ring laser

In another embodiment, the strongly injection-locked WRL shown in FIG. 3 may be implemented in any semiconductor material system (including III-V, II-VI, or IV-VI semiconductors) with high efficiency of anti-Stokes photoluminescence. The semiconductor material with high efficiency of anti-Stokes photoluminescence may be directly used as the active region material providing optical gain for lasing and, at the same time, providing cooling effect through the anti-Stokes photoluminescence. The size of the microring cavity should be small enough for a substantial part of anti-Stokes spontaneous emission to couple into guided modes/resonances of the cavity for efficient removal from the cavity through a properly designed directional outcoupler and, eventually, for directing it out from the cryogenic environment. The device can be integrated on a silicon-on-insulator (SOI) substrate.

Figure 4:
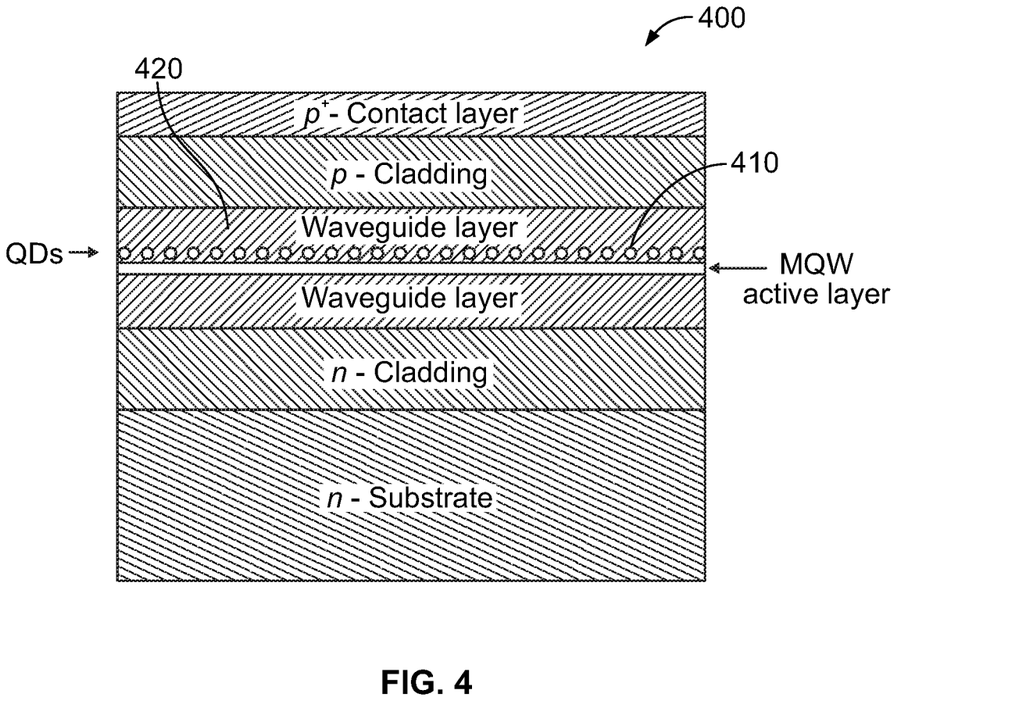
FIG. 4 illustrates an embodiment of the present invention providing a self-cooled semiconductor laser implemented in a dielectric-waveguide platform with multiple quantum wells (MQW) and nanoemitters such as quantum dots (QDs).

In another embodiment, as shown in FIG. 4, strongly injection-locked WRL 400 may have colloidal QD emitters 410 grown in any semiconductor material system (including III-V, II-VI, or IV-VI semiconductors) with high efficiency of anti-Stokes photoluminescence inserted into nanocavities prefabricated in the optical waveguide layer 420 of the epitaxial laser structure made of a wider-bandgap semiconductor material. The nanoemitters or QDs are optically pumped by the internal laser emission and provide cooling. The size of the microring cavity should be small enough for a substantial part of anti-Stokes spontaneous emission to couple into guided modes of the cavity for efficient removal from the cavity through a properly designed directional outcoupler and, eventually, for directing it out from the cryogenic environment. The device can be integrated on a silicon-on-insulator (SOI) substrate.

Self-Cooled PhC Edge-Emitting Semiconductor Laser

Figure 5:
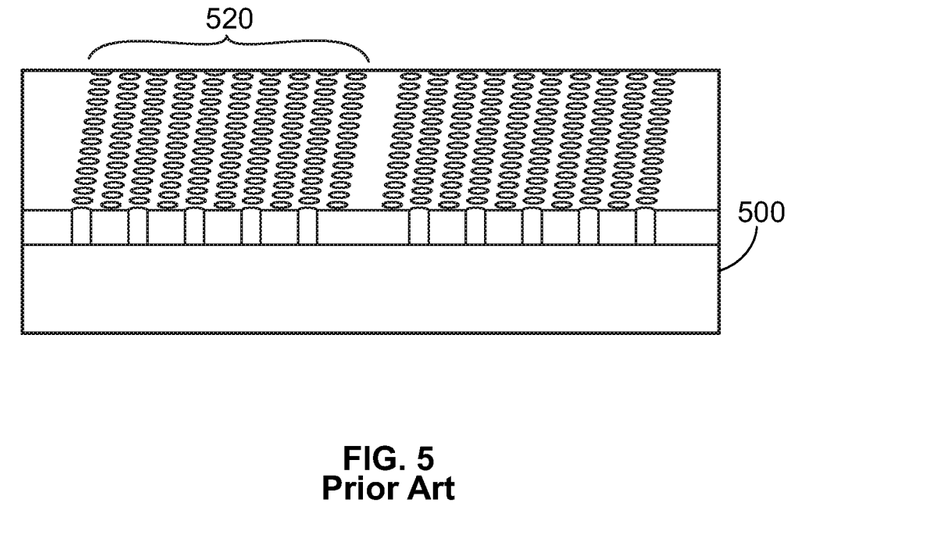
FIG. 5 shows the cleaved end of a single-line-defect slab photonic-crystal waveguide.

In other embodiments, the present invention provides a self-cooled 2D and 3D PhC edge-emitting FP lasers to ensure significantly improved directional output of spontaneous emission. When implemented in a 2D PhC-waveguide platform, as shown in FIG. 5, the edge-emitting FP lasers are realized as slab PhC waveguides 500 fabricated e.g. in cubic photonic lattices and terminated with mirror facets. Based on PBG confinement, ultra-compact lasers can be fabricated. As shown in FIG. 5, PhC waveguides can be formed by removing one or more rows of PhC air holes 520. The anti-Stokes spontaneous emission inside the cavity can be further controlled by a 3D PhC structure. In addition to the in-plane 2D confinement provided by the slab design described above, the spontaneous emission is also confined in the vertical direction by 1D stacks of distributed Bragg reflectors (DBRs) located below and above the 2D PhC laser. The peak reflectivity and bandwidth of the DBRs should match spontaneous emission spectrum of the active region of the laser and that of the embedded nanoemitters or QDs, thus confining both the Stokes and anti-Stokes components of the spontaneous emission to the laser cavity.

In other embodiments, the present invention provides 2D or 3D PhC edge-emitting FP semiconductor lasers implemented in any semiconductor material system (including III-V, II-VI, or IV-VI semiconductors) with high efficiency of anti-Stokes photoluminescence. The semiconductor material with high efficiency of anti-Stokes photoluminescence is directly used as the active region material providing optical gain for lasing and, at the same time, providing cooling effect through the anti-Stokes photoluminescence. The device can be integrated on a silicon-on-insulator (SOI) substrate.

Figure 6A:
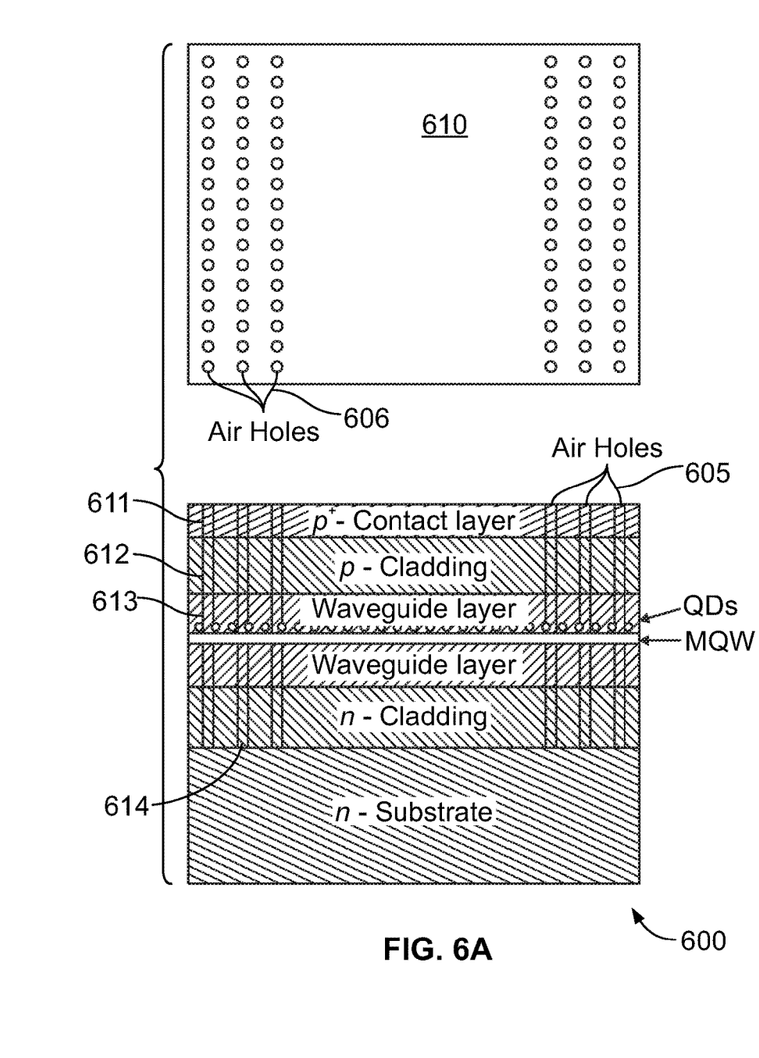
FIG. 6A shows a self-cooled PhC semiconductor laser implemented in a 2D PhC-waveguide platform prior to metallization for an embodiment of the present invention.
Figure 6B:
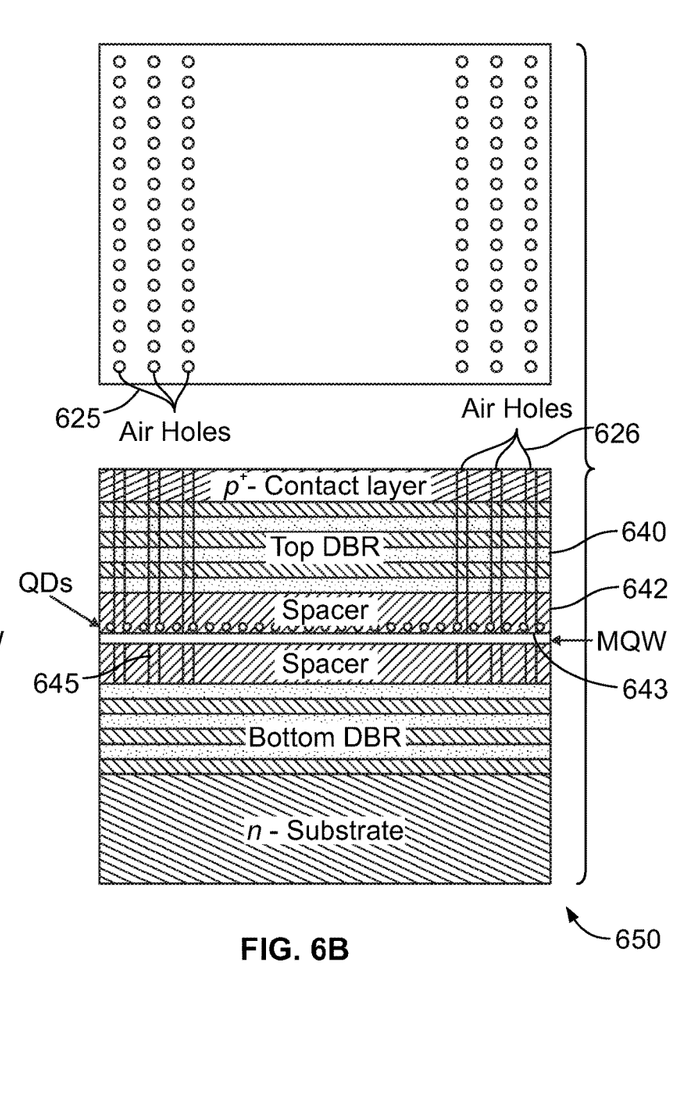
FIG. 6B shows a self-cooled PhC semiconductor laser implemented in a 3D PhC-waveguide platform prior to metallization for an embodiment of the present invention.

In other embodiments, as shown in FIGS. 6A-6B, the present invention provides 2D or 3D PhC edge-emitting FP semiconductor lasers where colloidal QD emitters grown in any semiconductor material system (including III-V, II-VI, or IV-VI semiconductors) with high efficiency of anti-Stokes photoluminescence are inserted into nanocavities prefabricated in the optical waveguide layer of the epitaxial laser structure made of a wider-bandgap semiconductor material. The QDs are optically pumped by the internal laser emission and provide cooling. The device can be integrated on a silicon-on-insulator (SOI) substrate.

As shown in FIG. 6A, 2D PhC edge-emitting FP laser 600 is formed using e-beam lithography and fabricated using the ICP etching. The 2D photonic crystal lattice is defined in the epitaxial wafer by etching holes 605-606, with the row defects representing the slab photonic waveguides. The holes will be etched through the top contact layer 610, upper cladding layers 611-12, active region 613, and down to the lower cladding layer 614. The 2D PhC lasers with different cavity length are obtained first by cleaving the processed laser wafer into bars and then by cleaving the bars into individual laser devices.

As shown in FIG. 6B, the fabrication process for 3D PhC Fabry-Perot laser 650 is similar to that of 2D PhC Fabry-Perot lasers. In this case, holes 625-626 defining the 2D photonic crystal lattice and the 2D slab photonic waveguide are etched through the top DBR layer 640, upper spacer layers 642, active region 643, and lower spacer layer 645. The term "spacer" is used as it is commonly used in vertical-cavity surface-emitting (VCSEL) literature, emphasizing the critical role of the spacer layer thickness in the vertical-cavity design. For preferred embodiment, the thickness is selected such as to reflect most of the anti-Stokes emission back into the waveguide core. The 3D PhC lasers with different cavity length are obtained first by cleaving the processed laser wafer into bars and then by cleaving the bars into individual laser devices.

In alternate embodiments, 2D PhC edge-emitting FP lasers may be formed using e-beam lithography and fabricated using the ICP etching. The 2D photonic crystal lattice is defined in the epitaxial wafer by etching holes, with the row defects representing the slab photonic waveguides. The holes will be etched through the top contact layer, upper cladding layer, active region, and down to the lower cladding layer. The 2D PhC lasers with different cavity length are obtained first by cleaving the processed laser wafer into bars and then by cleaving the bars into individual laser devices. The fabrication process for 3D PhC Fabry-Perot lasers is similar to that of 2D PhC Fabry-Perot lasers. In this case, the holes defining the 2D photonic crystal lattice and the 2D slab photonic waveguide are etched through the top DBR layer, upper spacer layer, active region, and lower spacer layer. The 3D PhC lasers with different cavity length are obtained first by cleaving the processed laser wafer into bars and then by cleaving the bars into individual laser devices.

In all PhC FP laser embodiments, a laser performance with minimized internal heating will be achieved by extracting a substantial part of the anti-Stokes spontaneous emission from the laser cavity and, eventually, from the cryogenic environment. NIR-emitting PbS and PbSe colloidal QDs are good candidates for many application, as their size-tunable absorption/emission spectra can be closely matched to 1.55-μm emission wavelength of the laser by a proper control of the colloidal synthesis. Many military and commercial applications exist for high-power lasers operating in this eye-safe spectral region, such as target identification in 3D lidars, ultra-high power lasers for missile defense systems, free-space optical communication, laser illumination, and laser machining in manufacturing.

The feasibility of achieving a substantial cooling power may be estimated by extracting the anti-Stokes spontaneous emission of the embedded nanoemitters or QDs from the laser cavity as follows. First, the concentration of embedded nanoemitters or QDs necessary to achieve a significant level of absorption of 1.55-μm internal laser emission by the nanoemitters or QDs is estimated. The absorption cross section for PbSe QDs of 5-nm diameter doped in glass at 1.55-μm excitation wavelength was extracted from FIG. 3 in to be $6_a = 1 \times 10^{-16}$ cm$^{-2}$ per one QD. The absorption coefficient of the material a [cm$^{-1}$] can then be calculated as $\alpha = 6_a N$, where N[cm$^{-3}$] is concentration of QDs. With the typical value of threshold modal gain in semiconductor lasers $g_{mod} \sim 10$-$20$ cm$^{-1}$, the modal absorption caused by QDs should be $\alpha_{mod} \sim 1$-$2$ cm$^{-1}$ for the absorption in QDs to be substantial and for the threshold current not to be strongly affected. Assuming one percent optical confinement for the layer of embedded QDs, the material absorption coefficient $\alpha \sim 100$-$200$ cm$^{-1}$ and the corresponding QD concentration $N \sim 1 \times 10^{18}$-$2 \times 10^{18}$ cm$^{-3}$, which corresponds, for example to $1 \times 10^{12}$-$2 \times 10^{12}$ cm$^{-2}$ sheet density of QDs for a 10-nm QD layer may be determined.

The condition $\alpha_{mod} \sim 0.1\, g_{mod}$ means the optical power absorbed by QDs, $P_{abs} \sim 0.1\, P_{out}$, since the modal gain is mostly determined by the outcoupling mirror losses. The cooling power is defined as $P_{cool} = P_{abs}\, \eta_{cool}$. Here $\eta_{cool} = \eta_{ext} \eta_{abs} \lambda_l / \lambda_f - 1$ is the cooling efficiency. The external quantum efficiency $\eta_{ext}$ represents the probability for an excited carrier to recombine by the desired radiative process and for the emitted fluorescence photon not to be reabsorbed. $\eta_{abs} = \alpha_r / (\alpha_r + \alpha_b)$ is the absorption efficiency representing the ratio of resonant absorption efficiency $\alpha_r$ of QDs to total absorption efficiency $\alpha_r + \alpha_b$. $\alpha_b$ is the background absorption efficiency. $\lambda_l$ is the wavelength of the laser and $\lambda_f$ is the mean wavelength of spontaneous emission. Assuming $\eta_{ext} \eta_{abs}$ (100% quantum efficiency of QDs, no photon trapping in the proposed PhC laser design, and negligible background absorption), and the demonstrated anti-Stokes shift in PbS QDs of 132 nm, $\eta_{cool} \sim 0.093$ and $P_{cool} \sim 0.093\, P_{abs} \sim 0.01 P_{out}$ are determined.

To mitigate the thermal rollover, one needs to compensate for the excess over-threshold Joule heating from the laser series resistance $R_s$. The ratio $\Delta_{cool} / \Delta P_{diss}$ for a single-emitter device characterized may be estimated. The incremental values $\Delta P_{cool}$ and $\Delta P_{diss}$ were calculated as:

$$\Delta P_{cool} = 0.01 \; \Delta P_{out} = 0.01(dP_{out}/dI)\Delta I$$

$$\Delta P_{diss} = 2I\Delta I R_s + (\Delta I)^2 R_s$$

Series resistance was extracted from FIG. 2 to be $R_s \sim 0.015 \; \Omega \; dP_{out}/dI=1.1$ W/A, as shown in FIG. 3, at I=2 mA, where the thermal rollover starts. The calculated value of $\Delta P_{cool}/\Delta P_{diss}$ is ~0.18. Better efficiency of mitigating the thermal rollover through optical cooling can be expected in high-power lasers as the laser technology improves further to allow for even smaller values of $R_s$. For example, it is estimated that $P_{cool}/\Delta P_{diss} \sim 0.55$ for $R_s = 0.005\Omega$, and $\Delta P_{cool}/\Delta P_{diss} \sim 0.92$ for $R_s = 0.003\Omega$, which implies 3 to 5 times reduction in $R_s$ compared to the current state-of-the-art.

Self-Cooled Injection-Locked PhC Ring Laser

The proposed concept is based on frequency selectivity of microring resonators and their ability to efficiently control spontaneous emission. The extremely small diameters of microring resonators, necessary for efficient control of spontaneous emission, translate into a very hard requirement for the optical waveguide: to make a compact ring, a small bend radius is required, and this in turn is only possible with high-refractive-index-contrast waveguides with strong optical confinement. Photonic crystal structures can overcome this challenge as they have the potential to achieve high-Q, low-loss resonators in ultra-compact cavities several times smaller than the minimum-possible-size dielectric-waveguide-based rings. In dielectric-waveguide-based resonators, the guided modes are supported by the total internal reflection, which sets the ultimate limit for size reduction—the radiation losses increase very rapidly with reduction in the ring radius. By contrast, the resonant modes in photonic crystal ring resonators (PCRRs) are supported by the photonic bandgap, which is much more efficient for optical confinement. The smallest PCRR can be a single point-defect cavity, which offers a very low loss with extremely high Q and ultra-small cavity volume.

Figure 7:
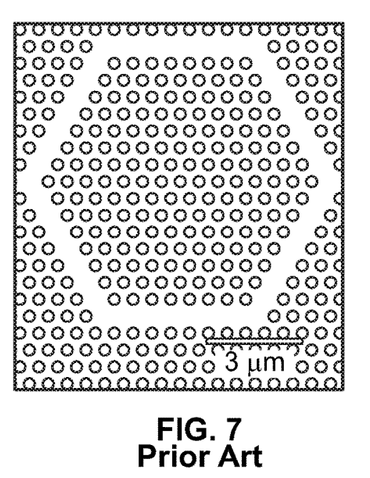
FIG. 7 shows a photonic-crystal ring cavity of a 1.55-μm InGaAsP/InP-based PhC ring laser.

The strongly injection-locked RL can be implemented in a 2D PhC-waveguide platform. All the functional elements of the injection-locked RL have been successfully realized using slab PhC waveguides. Based on PBG confinement, ultra-compact PCRRs can be fabricated in cubic, hexagonal, and other complex photonic lattices. The choice of the ring size is determined by the desired resonant wavelength, and the tradeoff between the cavity quality factor Q and the modal volume V. PhC waveguides (FIG. 5) and PCRRs (FIG. 7) can be formed by removing one or more rows of PhC dielectric columns/air holes or a ring (or racetrack) shape of dielectric rods/air holes, respectively. In general, dielectric-rod-type PhC waveguides can be easily operating in single mode while air-hole-type PhC waveguides tend to be multimode.

Figure 8:
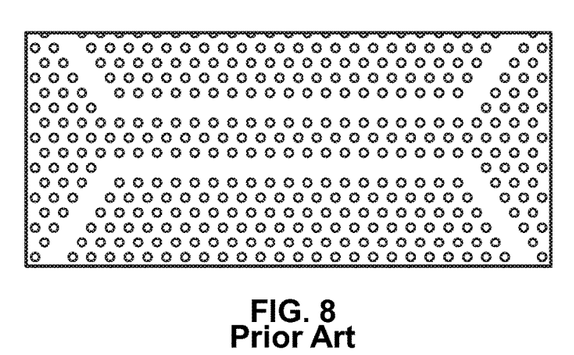
FIG. 8 shows a fabricated 2D-PhC slab directional coupler.

Photonic crystal directional couplers (FIG. 8) capable of short coupling length and wide bandwidth have been demonstrated. An ultra-short PhC waveguide coupler has been designed with coupling length less than 3a, where a is the PhC lattice constant. In other aspects, the present invention uses strong coupling efficiency of PhC directional couplers to implement the injecting waveguide.

The coupling properties of PhC directional couplers have been shown to be strongly wavelength dependent due to the large group velocity dispersion in the presence of the PBG. The coupling lengths are on a wavelength scale and show strong wavelength dependence, allowing for the design of compact wavelength-selective optical filters. In the present invention, this wavelength-selectivity of PhC directional couplers is used to design the outcoupling waveguide of FIG. 2 in such a way as to outcouple as much of the anti-Stokes spontaneous emission as possible, and to extract only a small portion of the injected/lasing Stokes emission (e.g., with 5% coupling efficiency), thus maintaining high Q of the ring cavity at the injected/lasing wavelength.

The PhC directional couplers have been demonstrated in various semiconductor material systems, such as InAlGaAs, InP, and GaN.

Figure 9:
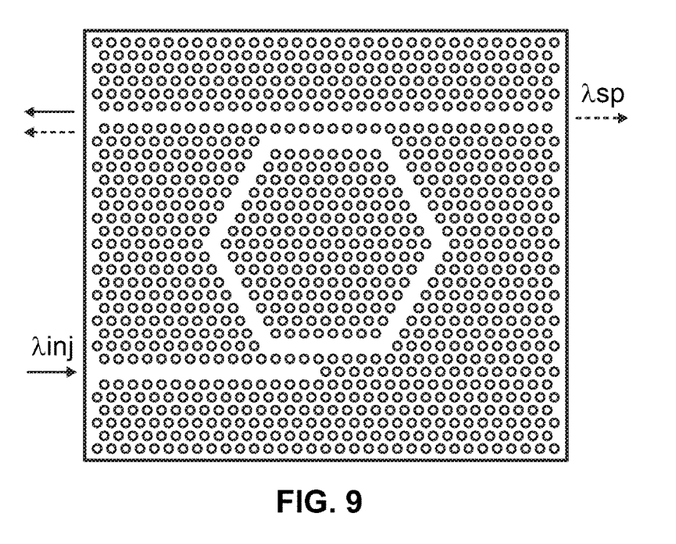
FIG. 9 shows a strongly injection-locked RL implemented in a 2D PhC-waveguide platform for an embodiment of the present invention.

The general concept of a strongly injection-locked RL implemented in a 2D photonic-crystal-waveguide platform is illustrated in FIG. 9. Ultra-compact PCRRs of circular, oval, racetrack, hexagonal, and other shapes can be fabricated in cubic, hexagonal, and other complex photonic lattices.

The period of the PhC lattice should is designed to achieve a wide PBG, covering the entire spontaneous emission spectrum of the active laser material. In this way, the spontaneous emission generated inside the PCRR will be directed only into the PCRR guided modes.

The wavelength-selectivity of PhC directional couplers will be also used, to the maximum possible extent, to prevent the anti-Stokes spontaneous emission from leaving the PCRR cavity through the injecting waveguide. Additionally, the core of the injecting waveguide can be modified with periodic air holes, making a PhC lattice with a period different from that of the main PhC lattice defining the PCRR. The purpose of that heterostructure PhC design is to reject the anti-Stokes spontaneous emission by making PBG in the core of the injecting waveguide narrower, thus confining the anti-Stokes spontaneous emission to the PCRR cavity and the outcoupling waveguide.

The anti-Stokes spontaneous emission inside the PCRR cavity can be further controlled by a 3D PhC structure. In addition to the in-plane 2D confinement provided by the slab PCRR design, the spontaneous emission is also confined in the vertical direction by 1D stacks of distributed Bragg reflectors (DBRs) located below and above the 2D PCRR. The peak reflectivity and bandwidth of the DBRs should match spontaneous emission spectrum of the active region of the PCRR, thus confining both the Stokes and anti-Stokes components of the spontaneous emission to the PCRR.

In other embodiments, the present invention provides 2D or 3D PhC injection-lockable self-cooled ring lasers implemented in any semiconductor material system (including III-V, II-VI, or IV-VI semiconductors) with high efficiency of anti-Stokes photoluminescence. The semiconductor material with high efficiency of anti-Stokes photoluminescence is directly used as the active region material providing optical gain for lasing and, at the same time, providing cooling effect through the anti-Stokes photoluminescence. The device can be integrated on a silicon-on-insulator (SOI) substrate.

In other embodiments, the present invention provides 2D or 3D PhC injection-lockable self-cooled ring lasers where colloidal QD emitters grown in any semiconductor material system (including III-V, II-VI, or IV-VI semiconductors) with high efficiency of anti-Stokes photoluminescence are inserted into nanocavities prefabricated in the optical waveguide layer of the epitaxial laser structure made of a wider-bandgap semiconductor material (FIG. 6). The nanoemitters or QDs are optically pumped by the internal laser emission and provide cooling. The device can be integrated on a silicon-on-insulator (SOI) substrate.

In all embodiments, the PhC RL performance with minimized internal heating will be achieved by extracting a substantial part of the anti-Stokes spontaneous emission from the RL cavity through a properly designed directional coupler and, eventually, from the cryogenic environment. In particular, this energy-efficient directly modulated laser source with very high modulation bandwidth of up to 100 GHz is particularly attractive for the cryogenic optical data link application.

While the foregoing written description enables one of ordinary skill to make and use what is considered presently to be the best mode thereof, those of ordinary skill will understand and appreciate the existence of variations, combinations, and equivalents of the specific embodiment, method, and examples herein. The disclosure should therefore not be limited by the above described embodiments, methods, and examples, but by all embodiments and methods within the scope and spirit of the disclosure.

What is claimed is:

1. A light-emitting device comprising:
a self-cooled semiconductor laser, said self-cooled semiconductor laser comprising:
a laser resonator with a waveguide having a core and bound by a slab photonic-crystal structure that is defined in a cubic, hexagonal, or complex photonic-crystal lattice fabricated in the same structure as said semiconductor laser;
nanoemitters having anti-Stokes photoluminescence when excited by an internal laser emission, said nanoemitters are located in said core of said waveguide;
said waveguide made of a wider-bandgap semiconductor material than said nanoemitters; and
wherein said nanoemitters are quantum dots.

2. The light-emitting device of claim 1, wherein said laser resonator is a Fabry-Perot cavity.

3. The light-emitting device of claim 1, wherein said laser resonator is a distributed-feedback cavity.

4. The light-emitting device of claim 1, wherein said laser resonator is a distributed Bragg reflector cavity.

5. The device of claim 1, where said laser resonator is a ring cavity.

6. The light-emitting device of claim 1, wherein said self-cooled semiconductor laser is an injection-lockable ring laser, comprising a ring laser, an injecting waveguide used to collect light from an external laser source and to deliver it to the ring laser, a waveguide directional output coupler proximate, in the lateral direction, to the cavity of the ring laser and used to collect its output; all monolithically integrated on the same substrate, and said ring laser has whistle geometry.

7. The light-emitting device of claim 1, wherein said laser resonator and said slab photonic-crystal structure are monolithically integrated on a substrate made of III-V or II-VI semiconductor materials.

8. The light-emitting device of claim 1, wherein said laser resonator and said slab photonic-crystal structure are monolithically integrated on a silicon-on-insulator substrate.

9. The device of claim 1, wherein said spontaneous emission is further confined in the vertical direction by one-dimensional stacks of distributed-Bragg-reflectors fabricated below and above said slab photonic-crystal laser cavity.

10. The light-emitting device of claim 9, wherein the peak reflectivity and bandwidth of the said distributed-Bragg-reflectors spectrally match the spontaneous emission circulating inside the photonic-crystal laser cavity.

11. A light-emitting device comprising:
a self-cooled semiconductor laser, said self-cooled semiconductor laser comprising;
a laser resonator with a waveguide having a core and bound by a slab photonic-crystal structure that is defined in a cubic, hexagonal, or complex photonic-crystal lattice fabricated in the same structure as said semiconductor laser;
nanoemitters having anti-Stokes photoluminescence when excited by an internal laser emission, said nanoemitters are located in said core of said waveguide;
said waveguide made of a wider-bandgap semiconductor material than said nanoemitters; and
wherein said nanoemitters are multiple quantum wells.

12. The light-emitting device of claim 11, wherein said laser resonator is a Fabry-Perot cavity.

13. The light-emitting device of claim 11, wherein said laser resonator is a distributed-feedback cavity.

14. The light-emitting device of claim 11, wherein said laser resonator is a distributed Bragg reflector cavity.

15. The device of claim 11, where said laser resonator is a ring cavity.

16. The light-emitting device of claim 11, wherein said self-cooled semiconductor laser is an injection-lockable ring laser, comprising a ring laser, an injecting waveguide used to collect light from an external laser source and to deliver it to the ring laser, a waveguide directional output coupler proximate, in the lateral direction, to the cavity of the ring laser and used to collect its output; all monolithically integrated on the same substrate, and said ring laser has whistle geometry.

17. The light-emitting device of claim 11, wherein said laser resonator and said slab photonic-crystal structure are monolithically integrated on a substrate made of III-V or II-VI semiconductor materials.

18. The light-emitting device of claim 11, wherein said laser resonator and the slab photonic-crystal structure are monolithically integrated on a silicon-on-insulator substrate.

19. The device of claim 11, wherein said spontaneous emission is further confined in the vertical direction by one-dimensional stacks of distributed-Bragg-reflectors fabricated below and above said slab photonic-crystal laser cavity.

20. The light-emitting device of claim 19, wherein the peak reflectivity and bandwidth of the said distributed-Bragg-reflectors spectrally match the spontaneous emission circulating inside the photonic-crystal laser cavity.

\* \* \* \* \*